United States Patent
Kojima et al.

(10) Patent No.: US 6,809,042 B2
(45) Date of Patent: Oct. 26, 2004

(54) OXIDE SUPERCONDUCTOR THICK FILM AND METHOD FOR MANUFACTURING THE SAME

(75) Inventors: Masahiro Kojima, Tokyo (JP);
Masakazu Kawahara, Tokyo (JP);
Michiharu Ichikawa, Yokosuka (JP);
Hiroyuki Kado, Yokosuka (JP);
Masatoyo Shibuya, Yokosuka (JP)

(73) Assignees: Dowa Mining Co., Ltd., Tokyo (JP);
Central Research Institute of Electric Power Industry, Yokosuka (JP)

(*) Notice: Subject to any disclaimer, the term of this patent is extended or adjusted under 35 U.S.C. 154(b) by 0 days.

(21) Appl. No.: 10/227,440

(22) Filed: Aug. 26, 2002

(65) Prior Publication Data

US 2003/0096709 A1 May 22, 2003

(30) Foreign Application Priority Data

Nov. 22, 2001 (JP) .................................... 2001-358298

(51) Int. Cl.[7] ........................ H01L 21/31; H01L 21/469
(52) U.S. Cl. .................... 438/785; 505/121; 505/125; 505/162; 505/701; 505/782; 505/807; 361/19; 427/62
(58) Field of Search ...................... 438/785; 505/29, 505/174, 162, 204, 121, 125, 701, 775–785, 807; 361/19; 427/62

(56) References Cited

U.S. PATENT DOCUMENTS 5,021,398 A * 6/1991 Sharma et al. .............. 505/413
5,045,527 A * 9/1991 Ikeno et al. ................ 505/410
5,189,011 A * 2/1993 Itozaki et al. .............. 505/121
5,189,101 A * 2/1993 Burlett et al. ................ 525/90
5,194,421 A * 3/1993 Shimoda et al. ............ 505/121
5,202,305 A * 4/1993 Watanabe et al. ............. 505/1

(List continued on next page.)

FOREIGN PATENT DOCUMENTS

| JP | A 1-226783 | | 9/1989 | |
| JP | 402124717 A | * | 5/1990 | ........... C01G/29/00 |
| JP | 3-75259 | * | 3/1991 | ........... C04B/35/00 |
| JP | A 3-150209 | | 6/1991 | |
| JP | 408245297 A | * | 9/1996 | ........... C30B/29/22 |

OTHER PUBLICATIONS

Ramesh et al. "Polytypoid structure of Pb–modified Bi–Ca–Sr–Cu–O superconductor" Oct. 1, 1988, Physical rev. B vol. 38 No. 10 p. 7070–7073.*

(List continued on next page.)

Primary Examiner—Matthew Smith
Assistant Examiner—Granvill D. Lee, Jr.
(74) Attorney, Agent, or Firm—Oliff & Berridge, PLC

(57) ABSTRACT

The present invention provides an oxide superconductor thick film which is formed on a substrate or a board and has a high Jc and Ic and a method for manufacturing the same. Predetermined amounts of materials containing elements of Bi, Pb, Sr, Ca and Cu are weighed, mixed and subjected to steps of calcining, milling, and drying, and thereafter an organic binder and an organic vehicle are added thereto to prepare a $(Bi, Pb)_{2+a}Sr_2Ca_2Cu_3O_z$, superconductive paste, which is applied to the surface of a substrate or a board in a thickness of 260 μm or more and dried. Thereafter, the paste is first subjected to burning at temperatures of 835° C. to 840° C. for 100 hours, then pressurization, and further burning at temperatures of 835° C. to 840° C. for 100 hours, thereby preparing an oxide superconductor thick film having a film thickness of 130 μm or more having a high Jc and Ic.

2 Claims, 8 Drawing Sheets

U.S. PATENT DOCUMENTS

| | | | | |
|---|---|---|---|---|
| 5,238,911 A | * | 8/1993 | Kuwajima et al. | 505/121 |
| 5,240,903 A | * | 8/1993 | Shimoyama et al. | 505/125 |
| 5,273,957 A | * | 12/1993 | Schwarz et al. | 505/1 |
| 5,276,012 A | * | 1/1994 | Ushida et al. | 505/447 |
| 5,300,482 A | * | 4/1994 | Doi et al. | 505/120 |
| 5,306,702 A | * | 4/1994 | Tanaka et al. | 505/473 |
| 5,540,981 A | * | 7/1996 | Gallagher et al. | 428/220 |
| 5,541,154 A | * | 7/1996 | Neubacher et al. | 505/450 |
| 5,603,983 A | * | 2/1997 | Clough et al. | 427/126.3 |
| 5,648,320 A | * | 7/1997 | Jacobs | 505/471 |
| 6,043,198 A | * | 3/2000 | Neubacher et al. | 505/121 |
| 6,216,333 B1 | * | 4/2001 | Kojima et al. | 29/599 |
| 6,689,319 B1 | * | 2/2004 | Fisher et al. | 422/67 |

OTHER PUBLICATIONS

Numata et al. "Metallurgical studies and optimization of sintering for the Bi–Sr–Ca–Cu–O superconductors" Dec. 1, 1988, J. Appl. Phys. 64(11) p. 6392–6395.*

Luo et al. "Effect of Pb and Sb substitutions on superconducting Bi–Sr–Ca–Cu–O prepared by oxidation of liquid–quenched precursor alloys" Oct. 2, 1989, Appl. Phys. Lett. 55(14) p. 1448–1450.*

Tanaka et al. "Composition dependence of high Tc phase formation in Pb–doped Bi–Sr–Ca–Cu–O thin films" Sep. 18, 1989 Appl. Phys. Lett. 55(12) p. 1252–1254.*

Ramesh et al. "New modulated structure in a Pb–doped Bi–Ca–Sr–Cu–O superconductor" Appl. Phys. Lett. 53 (22), Nov. 26, 1988 p. 2220–2222.*

Ullrich et al. "Sinter conditions and superconducting properties of Bi–Pb–Sr–Ca–Cu–O superconductors" Sunpercond. Sci Technol. 3 (1990) p. 602–605.*

* cited by examiner

FIG.1

| FILM THICKNESS($\mu$m) | Jc (A/cm²) | Ic (A) |
|---:|---:|---:|
| 30 | 400 | 0.6 |
| 60 | 533 | 1.6 |
| 85 | 682 | 2.9 |
| 95 | 674 | 3.2 |
| 110 | 1000 | 5.5 |
| 130 | 3846 | 25 |
| 180 | 6000 | 54 |
| 230 | 6783 | 78 |
| 270 | 7037 | 95 |
| 410 | 6683 | 137 |
| 530 | 6226 | 165 |

Fig.4

| FILM THICKNESS($\mu$m) | Jc (A/cm²) | Ic (A) |
|---:|---:|---:|
| 50 | 6000 | 15 |
| 100 | 4000 | 20 |
| 130 | 3385 | 22 |
| 160 | 3125 | 25 |
| 200 | 2700 | 27 |
| 300 | 2067 | 31 |

Fig.6

|  | Bi | Pb | Sr | Ca | Cu |
|---|---|---|---|---|---|
| BULK BODY SAMPLE | 1 | 1 | 1 | 1 | 1 |
| THICK FILM SAMPLE | 0.97 | 0.13 | 1.04 | 1.01 | 1.00 |

OXIDE SUPERCONDUCTOR THICK FILM AND METHOD FOR MANUFACTURING THE SAME

BACKGROUND OF THE INVENTION

1. Field of the Invention

The present invention relates to an oxide superconductor thick film containing Bi, Pb, Sr, Ca and Cu having a high critical current density, and a method for manufacturing the same.

2. Description of the Related Art

An oxide substrate or an oxide board such as MgO, alumina or YSZ, or a metal substrate or a metal board such as Ag, Au, Pt or Ni is formed with an oxide superconductor in film form to function, so as to devise a variety of applied products.

As a method of forming this oxide superconductor into film form, a technique is tried in which oxide superconductive synthetic powder that is oxide superconductor powder, to which an appropriate organic binder is added, is made into paste form, thereafter applied to the surface of the substrate or the board using the screen printing method, the doctor blade method, the spray method, or the like, and burned to thereby form a polycrystalline oxide superconductor thick film.

This technique of forming the oxide superconductor thick film has a quite low manufacturing cost, that is, an advantage because of no need for an expensive single crystal substrate and a large-scale and expensive apparatus requiring a high vacuum system represented by PVD, CVD or the like, and thus it is considered as the technique closest to practical use.

Conventionally, as an oxide superconductor materiel for forming this thick film, it has mainly been tired to use the YBCO family having a composition of $Y_1Ba_2Cu_3O_x$, the Bi2212 family having a composition of $Bi_2Sr_2Ca_1Cu_2O_y$, and the Bi2223 family having a composition of $(Bi, Pb)_{2+a}Sr_2Ca_2Cu_3O_z$. (Note that, generally, 0<a<0.5, and this applies to the following.)

When the oxide superconductor thick film is applied here to a practical product, a critical current density (hereafter, described as "Jc") of 3,500 A/cm² or more is required at the temperature of liquid nitrogen.

From this point of view, the conventional art of the above-described oxide superconductor is briefly explained.

For example, an oxide superconductor thick film (hereinafter, described as a "thick film") containing $Y_1Ba_2Cu_3O_x$ can attain a Jc of several hundred A/cm² at the temperature of liquid nitrogen. A critical current value (hereafter, described as "Ic") of about several A can be attained in a thick film sample thereof having a width of 5 mm and a thickness of 100 μm.

It is difficult, however, to align the crystal orientation of $Y_1Ba_2Cu_3O_x$ in the form of the thick film of the oxide superconductor, that is, a polycrystal, and accordingly it is difficult to attain the aforesaid Jc or more.

Further, for example, a thick film containing $Bi_2Sr_2Ca_1Cu_2O_y$ can attain a Jc of 6000 A/cm² at the temperature of liquid nitrogen, an Ic of about 10 A to about 15 A in a thick film sample thereof having a width of 5 mm, a thickness of 50 μm and so on, and thus it is a potential material.

In this material, however, superconducting characteristics sharply decrease as the film thickness of the sample is increased to attain a higher Ic. As a result, with an increase in film thickness, the value of Jc, obtained by averaging the values of the whole thick film, decreases, such that even a thick film produced having, for example, a width of 5 mm and a thickness of 100 μm has an Ic of about 20 A and a Jc of as small as about 4000 A/cm². Even if the film thickness is increased more, the Ic does not increase in proportion thereto, but conversely the averaged Jc keeps on decreasing.

Further, for example, as for a thick film containing $(Bi, Pb)_{2+a}Sr_2Ca_2Cu_3O_z$, a thick film sample having a thickness of 100 μm is currently manufactured and can attain a Jc of several hundred A/cm² at the temperature of liquid nitrogen, and an Ic of about several A in a thick film sample thereof having a width of 5 mm. The Jc exhibited by this thick film, however, is about one-tenth of the value expected from the value of a Jc offered by a similar bulk body containing $(Bi, Pb)_{2+a}Sr_2Ca_2Cu_3O_z$. Furthermore, when the film thickness of the thick film is increased to be 100 μm or more to attain a higher Ic, the oxide superconductor peels from the surface of the substrate or the board in the aforesaid burning, and thus the oxide superconductor containing $(Bi, Pb)_{2+a}Sr_2Ca_2Cu_3O_z$ is considered to be difficult to use as a thick film material.

SUMMARY OF THE INVENTION

Under the above-described situation, a problem that the present invention solves is to provide an oxide superconductor thick film having a high Jc and Ic and a method for manufacturing the same.

A first means for solving the above problem according to the present invention is an oxide superconductor thick film containing Bi, Pb, Sr, Ca and Cu to be formed on a surface of a substrate or a board, characterized in that a film thickness of the thick film is 130 μm or more.

By setting the film thickness of the oxide superconductor thick film containing Bi, Pb, Sr, Ca and Cu to be formed on a surface of a substrate or a board at 130 μm or more, the Jc and Ic exhibited by the thick film can be greatly improved.

A second means is an oxide superconductor thick film containing Bi, Pb, Sr, Ca and Cu to be formed by applying oxide superconductive synthetic powder onto a surface of a substrate or a board and burning the powder, wherein 30 wt % or more of Pb contained in the applied oxide superconductive synthetic powder is retained in the thick film.

The oxide superconductor thick film which has the above-described configuration and contains Bi, Pb, Sr, Ca and Cu to be formed on the surface of a substrate or a board has a high Jc and Ic.

A third means is an oxide superconductor thick film containing Bi, Pb, Sr, Ca and Cu to be formed on a surface of a substrate or a board, characterized in that where oxide superconductive synthetic powder having a mole ratio of Bi:Pb:Sr:Ca:Cu=1.85:0.35:1.90:2.05:3.05 is burned at 850° C. for 100 hours and then compressed with a pressure of 3 ton/cm² using a CIP, and further burned at 850° C. for 100 hours to prepare a bulk body of an oxide superconductor containing $(Bi, Pb)_{2+a}Sr_2Ca_2Cu_3O_z$ (Note: 0<a<0.5), and a strength of a signal of Pb contained in a center part of the bulk body is measured by an EPMA and the signal strength is normalized as 1, when a strength of a signal of Pb contained in the thick film direct on the surface of the substrate or the board is measured by the EPMA, a relative strength of the signal of Pb is 0.67 or more.

The oxide superconductor thick film which has the above-described configuration and contains Bi, Pb, Sr, Ca and Cu to be formed on the surface of a substrate or a board has a high Jc and Ic.

A fourth means is an oxide superconductor structure, characterized in that the oxide superconductor thick film according to any one of the first to the third means is formed on a surface of a substrate or a board.

According to the above-described configuration, an oxide superconductor structure having a high Jc and Ic can be obtained at a low manufacturing cost.

A fifth means is a method for manufacturing an oxide superconductor thick film containing Bi, Pb, Sr, Ca and Cu to be formed on a surface of a substrate or a board characterized by comprising the steps of:

when producing the thick film, applying an oxide superconductor paste to the surface of the substrate or the board to have a film thickness of 260 $\mu$m or more, and burning the paste at burning temperatures of 830° C. to 850° C.

By employing the above-described manufacturing method, it is possible to manufacture an oxide superconductor thick film containing Bi, Pb, Sr, Ca and Cu and having a film thickness of 130 $\mu$m or more.

BRIEF DESCRIPTION OF THE DRAWINGS

FIG. 1 is a table showing film thicknesses and measurement results of the Jcs and Ics of thick film samples according to the present invention;

FIG. 4 is a table showing film thicknesses and measurement results of the Jcs and Ics of thick film samples according to a comparison example;

FIG. 6 is a table showing results of analysis of respective elements constituting a bulk body sample and a thick film sample related to the prior art;

DETAILED DESCRIPTION OF THE PREFERRED EMBODIMENT

Figure 2A:
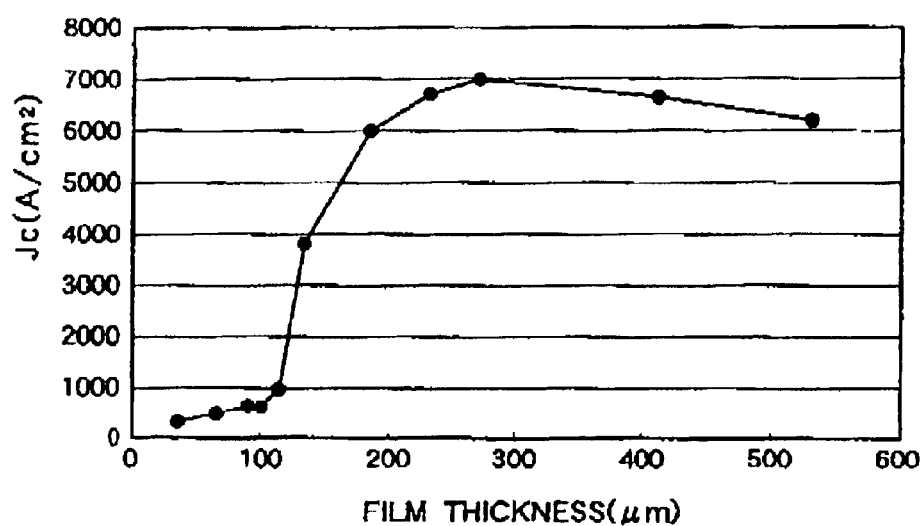
FIGS. 2A and 2B are graphs of the film thicknesses and the Jcs and Ics of the thick film samples according to the present invention.

To obtain an oxide superconductor thick film having a high Jc and Ic, the present inventor prepared oxide superconductive synthetic powder containing Bi, Pb, Sr, Ca and Cu, and made the powder into paste form by adding thereto an organic binder and a solvent and thereafter applied it to the surface of a substrate or a board to study on the relationship between the burning temperature of the applied paste and peeling thereof from the surface of the substrate or the board. As a result, the present inventor found that when the burning is performed at temperatures beyond 850° C. at which the burning has been performed conventionally, the crystal growth rate of $(Bi, Pb)_{2+a}Sr_2Ca_1Cu_3O_z$ is great to cause a thick film to rapidly grow toward the substrate and the surface of the substrate, resulting in occurrence of peeling thereof from the surface of the substrate or the board.

Hence, after much trial and error to prevent the above-described peeling, the present inventor found that by burning a thick film of $(Bi, Pb)_{2+a}Sr_2Ca_2Cu_3O_z$ within a range from 830° C. to 850° C. lower than the burning temperatures in the prior art, more preferably ranging from 835° C. to 840° C., even when a thick film of 130 $\mu$m or more is film formed on the surface of a substrate or a board, peeling never occurs as well as the Jc and Ic of the thick film greatly increase.

Hereafter, as an example of the oxide superconductor thick film containing Bi, Pb, Sr, Ca and Cu, a thick film is explained which is obtained by burning a paste of the oxide superconductive synthetic powder containing Bi, Pb, Sr, Ca and Cu (hereafter, described as a "super conductive paste") applied on the surface of a substrate or a board.

Powders of $Bi_2O_3$, PbO, $SrCO_3$, $CaCO_3$ and CuO are weighed to have a desired mole ratio and mixed together. $CaCO_3$ in this case may be CaO or $Ca(OH)_2$. Alternatively, a material may also be used which was prepared such that elements of Bi, Pb, Sr, Ca: and Cu have a desired mole ratio by the wet coprecipitation method or the like.

Then, this mixed powder is calcined to obtain calcined powder. The calcining conditions are between 600° C. and 1000° C., more preferably 750° C. and 850° C., for 3 hours to 50 hours.

Subsequently, the calcined powder is put in a ceramic pot together with zirconia balls and an organic solvent such as toluene or the like, and ball-milled. This operation can finely mill the calcined powder to improve uniformity thereof and increase thermal reaction of the calcined powder in the following burning step.

The calcined powder in the form of slurry for which the ball milling has been completed is dried in a dryer.

Then, the calcined powder after the drying was burned on burning conditions of 750° C. to 850° C. for 3 hours to 50 hours and then subjected to the above-described ball milling, and thereafter this series of "burning-ball milling-drying" was repeated once to five times (preferably, twice to three times) to prepare superconductive synthetic powder.

The prepared superconductive synthetic powder was mixed with an appropriate organic binder and organic vehicle and kneaded using a triple roller or the like to obtain a superconductive paste.

The obtained superconductive paste was applied to the surface of the substrate or the board in various film thicknesses and dried, and then burned to provide thick film samples of the oxide superconductor.

The film thickness of the thick film sample becomes approximately half the film thickness of the applied superconductive paste, and thus the superconductive paste is suitably applied in a thickness of, for example, about 260 $\mu$m to obtain a film thickness of 130 $\mu$m, and about 1060 $\mu$m to obtain a film thickness of 530 $\mu$m.

The burning conditions were set such that the burning temperature ranged from 830° C., to 850° C., more preferably 835° C. to 840° C., and the burning period ranged from 50 hours to 100 hours.

The thick film samples after the burning were compressed with pressures of 2 ton/cm$^2$ to 3 ton/cm$^2$ using a CIP (cold isostatic press) device. The reason is to make plate-like crystals of $(Bi, Pb)_{2+a}Sr_2Ca_2Cu_3O_z$ produced by the burning orient such that ab faces thereof through which superconducting current easily flows are aligned in the conducting direction.

The thick film samples after the pressurization and compression were burned again at burning temperatures of 830° C. to 850° C., more preferably 835° C. to 840° C. and burning periods of 50 hours to 100 hours.

This made it possible to eliminate peeling of the thick film samples, even having thicknesses of 100 $\mu$m or more, from the surface of the substrate or the board after the burning and to prepare thick film samples having film thicknesses up to about 1000 µm.

As a result, eleven types of $(Di, Pb)_{2+a}Sr_2Ca_2Cu_3O_z$ thick film samples having film thicknesses of 30 µm to 530 µm were prepared in the present embodiment.

The Jcs and Ics of the superconducting characteristics exhibited by these eleven types of thick film samples are explained with reference to FIG. 1 and FIGS. 2A and 2B.

Figure 2B:
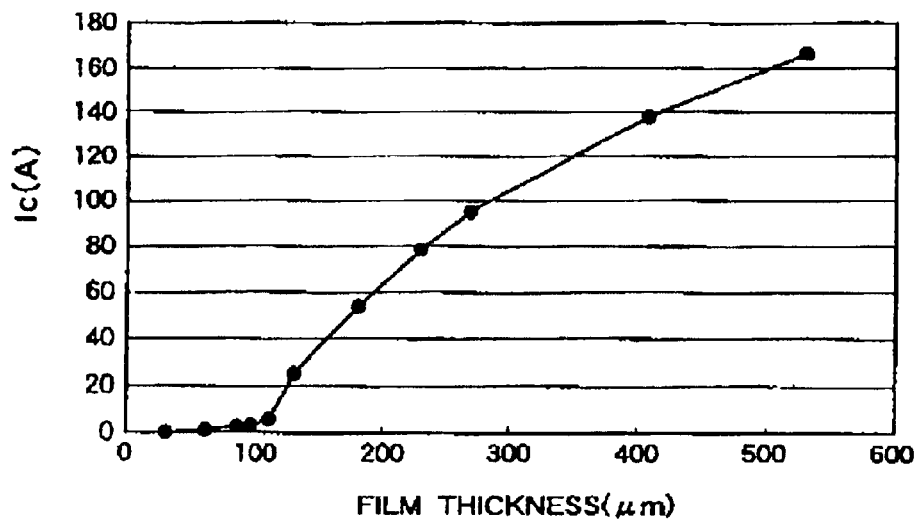

FIG. 1 is a table showing the film thicknesses and measurement results of the Jcs and Ics of the eleven types of the thick film samples, FIG. 2A is a graph showing the results in FIG. 1 with the Jc ($A/cm^2$) of the thick film sample plotted on the vertical axis and the film thickness (µm) after the burning of the thick film sample plotted on the horizontal axis, and FIG. 2B is a graph showing the results in FIG. 1 with the Ic (A) of the thick film sample plotted on the vertical axis and the film thickness (µm) of the thick film sample plotted on the horizontal axis.

It should be noted that the measurement of the Jc and Ic of the thick film sample was performed by providing electrodes on the thick film sample using a silver paste, cooling it to 77 K with liquid nitrogen, measuring the Ic by a four probe method (an energization method), and then calculating the Jc from the measured Ic and the cross-sectional area of the sample.

As is clear from FIG. 1 and FIG. 2A, in the case of the film thickness of the thick film formed on the surface of the substrate or the board of 110 µm or lower, the Jc of the thick film sample gradually increases with increases in film thickness such that the value thereof is about 400 $A/cm^2$ for a film thickness of 30 µm and about 1000 $A/cm^2$ for 110 µm. However, when the film thickness increases more, the value of the Jc substantially increases to reach about 3850 $A/cm^2$ for a film thickness of 130 µm and about 7000 $A/cm^2$ for 270 µm.

The Jc did not increase even when the film thickness increased more than that but rather showed a tendency to decrease, but was still 6200 $A/cm^2$ for a film thickness of 530 µm.

On the other hand, as is clear from FIG. 1 and FIG. 2B, in the case of the film thickness of the thick film of 110 µm or lower, the Ic of the thick film sample gradually increases with increases in film thickness such that the value thereof is about 0.6 A for a film thickness of 30 µm and about 5.5 A for 110 µm. However, when the film thickness increased more, the value of the Ic substantially increased to reach about 25 A for a film thickness of 130 µm and about 95 A for 270 µm, and further increased with increases in film thickness to reach about 165 A for a film thickness of 530 µm.

Subsequently, six types of thick film samples having film thicknesses of 85 µm, 110 µm, 130 µm, 180 µm, 270 µm and 530 µm were selected from among the prepared eleven types of thick film samples, and their thick films were obtained by peeling and subjected to quantitative analysis by the ICP on the concentration of Pb contained in the thick films. At the same time, a quantitative analysis by the ICP was also conducted on the Pb concentration of the superconductive synthetic powder which was used as the superconductive paste.

The results thereof are explained with reference to FIG. 8.

Figure 8:
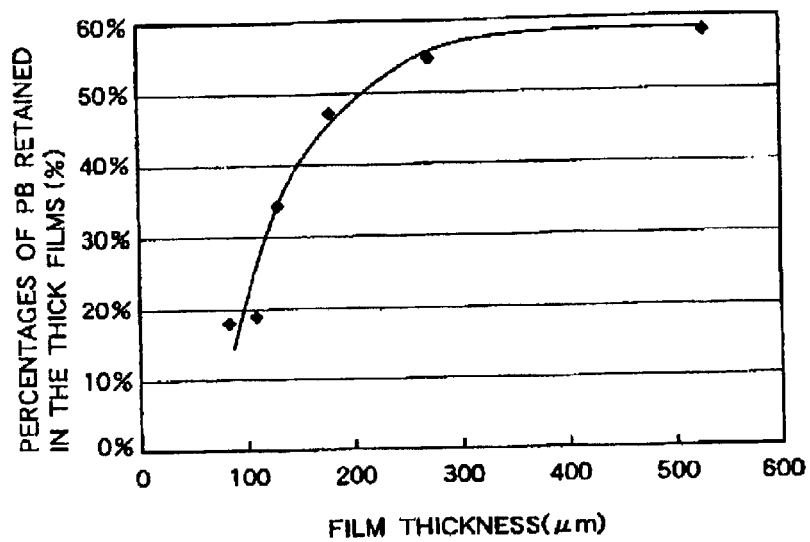
FIG. 8 is a graph of film thicknesses of thick film samples according to the present invention and percentages of Pb retained in the thick films.

FIG. 8 is a graph showing the percentage of Pb in the superconductive synthetic powder being retained in the thick film sample, which is calculated from the Pb concentration of the superconductive synthetic powder used as the superconductive paste and the concentration of Pb contained in each thick film, plotted on the vertical axis, and the thickness value of thick film sample plotted on the horizontal axis.

It is found from FIG. 8 that the percentage of retaining Pb is less than 20% when the film thickness value of the thick film sample is 110 µm or less. In contrast to this, when the film thickness value is 130 µm, the percentage of retaining Pb exceeds 30%, and thereafter the percentage of retaining Pb also increases with an increase in the film thickness value.

Further, six types of thick film samples having film thicknesses of 85 µm, 110 µm, 130 µm, 180 µm, 270 µm and 530 µm were subjected to line analysis in the direction of the film thickness, using the EPMA, on Pb concentrations contained in the thick films.

The results thereof are explained with reference to FIG. 3.

Figure 3:
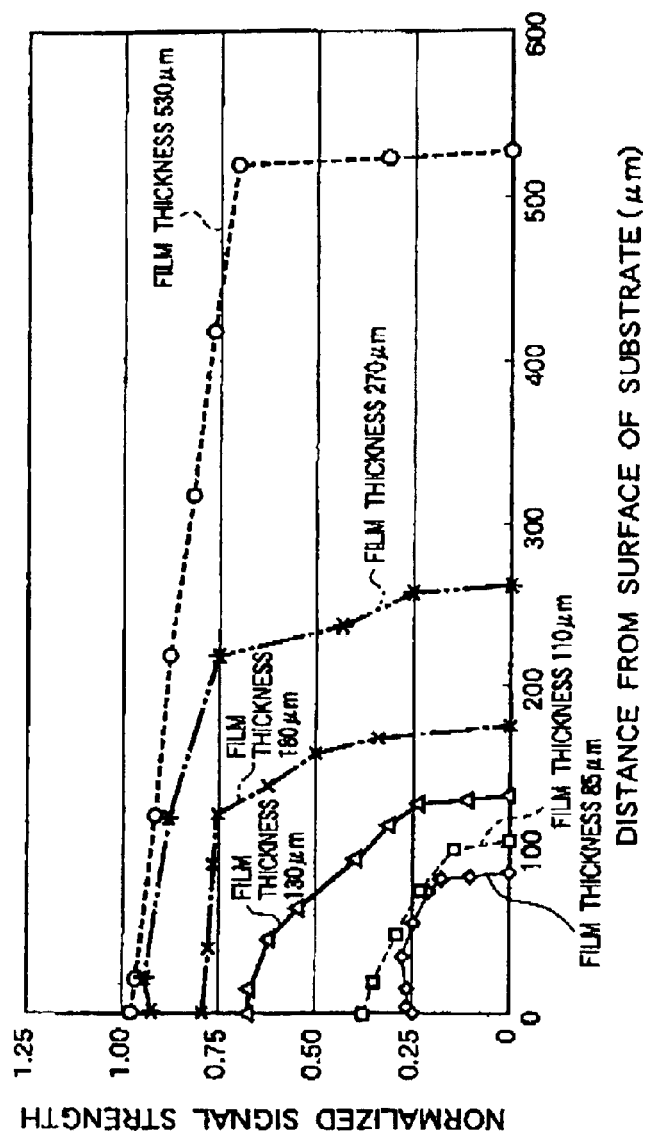
FIG. 3 is a graph showing measurement results of line analysis of the Pb concentration in a direction of the film thickness in each thick film sample according to the present invention.

FIG. 3 is a graph showing the relative strength of a signal of Pb contained in the direction of the film thickness of each thick film sample plotted on the vertical axis and the position in the direction of the film thickness in the thick film sample plotted on the horizontal axis.

The relative strength of the signal of Pb was obtained here by the following method.

First of all, powders of $Bi_2O_3$, PbO, $SrCO_3$, $CaCO_3$ and CuO were weighed to have a mole ratio of 1.85:0.35:1.90:2.05:3.05 and mixed together to produce mixed powder.

This mixed powder was calcined in the atmosphere at 780° C. for 10 hours to produce calcined powder.

The calcined powder was put in a ceramic pot together with zirconia balls as milling media and toluene as a solvent and set on a rotating table to be subjected to ball milling, and the calcined powder in the form of slurry for which the ball milling was completed was dried in a dryer.

The calcined powder after completion of the drying was burned again in the atmosphere at 780° C. for 10 hours and then subjected to ball milling and drying. It should be noted that the process was performed on the same milling conditions and drying conditions as those of the first time.

Then, this series of operation of "burning-milling-drying" was repeated three times to obtain superconductive synthetic powder.

The superconductive synthetic powder obtained in the above step was burned at 850° C. for 100 hours and then compressed with a pressure of 3 $ton/cm^2$ using the CIP, and further burned at 850° C. for 100 hours to prepare a bulk body of the oxide superconductor having a diameter of 25 mm and a thickness of 1.5 mm which has a composition of $(Bi, Pb)_{2+a}Sr_2Ca_2Cu_3O_z$. An example of this bulk body exhibited a density of about 5.1 $g/cm^3$ and a Jc of about 5000 $A/cm^3$.

The signal strength of Pb contained in the center part of the bulk body is measured by the EPMA and normalized as 1.

On the other hand, with a position direct on the surface of the substrate or the board in the thick film sample being 0 µm, a position in the thick film is indicated by the distance therefrom to the surface of the thick film, and the signal strength of Pb contained at each position is measured by the EPMA to obtain by calculation the relative strength to the normalized signal strength of the bulk body.

It should be noted that, to match measurement conditions of the bulk body and the thick film sample in the EPMA measurement, it is preferable to simultaneously perform measurement on both samples.

Further, in FIG. 3, among the thick film samples, the sample having a film thickness of 85 µm is shown by a solid line, the sample having a film thickness of 110 µm is shown by a broken line, the sample having a film thickness of 130 µm is shown by a thick solid line, the sample having a film thickness of 180 µm is shown by a thick one-dotted chain line, the sample having a film thickness of 270 µm is shown by a thick two-dotted chain line, and the sample having a film thickness of 530 µm is shown by a thick broken line.

As is clear from the results in FIG. 3, it was shown that in the case of the thick film sample having a small film thickness, the signal strength of Pb decreases not only at the surface of the thick film but also in a deep portion closest to the surface of the substrate or the board.

For example, in the case of the thick film sample having a film thickness of 85 $\mu$m, the signal strength of Pb is 0.26 even at the highest position, and in the case of the thick film sample having a film thickness of 110 $\mu$m, the signal strength of Pb is 0.38 even at the highest position.

In contrast to these, it was also shown that in the case of the thick film sample having a large film thickness, the signal strength of Pb not only is high in a deep portion closer to the surface of the substrate or the board but also slowly decreases toward the surface of the thick film.

For example, in the case of the thick film sample having a film thickness of 130 $\mu$m, the signal strength of Pb is 0.67, which is the highest, at the position direct on the substrate, and a signal strength of Pb of about 0.55 is kept at a position of about 65 $\mu$m. In the case of the thick film sample having a film thickness of 180 $\mu$m, the signal strength of Pb is 0.78 at the highest position, and a signal strength of, Pb of about 0.75 is kept at a position of about 120 $\mu$m. In the case of the thick film sample having a film thickness of 270 $\mu$m, the signal strength of Pb is 0.9 at the highest position, and a signal strength of Pb of about 0.75 is kept at a position of about 220 $\mu$m. In the case of the thick film sample having a film thickness of 530 $\mu$m, the signal strength of Pb is 0.97 at the highest position, and a signal strength of Pb of about 0.7 is kept at a position of about 500 $\mu$m.

It should be noted that the signal strength of Cu was measured in parallel with the signal strength of Pb in each of the above described thick film samples, and the signal strength of Cu was substantially fixed among the positions of each thick film sample.

From the above results, it was shown that Pb is lost to a greater extent in burning as the film thickness of the thick film sample decreases, and the degree of losing Pb is suppressed as the film thickness increases. In other words, it is conceivable that volatilization of Pb from the surface of the thick film sample is suppressed more as the film thickness of the thick film sample increases, thereby suppressing compositional deviation caused by a loss of Pb which greatly affects the superconducting characteristics, resulting in a substantial increase in the Jc and Ic of the thick film sample.

In addition, the burning conditions of 830° C. to 850° C., which were set at the beginning for the purpose of preventing peeling of the thick film from the surface of the substrate or the board, were effective in reducing thermal activity in terms of suppressing a loss of Pb due to volatilization. Thus, it is conceivable that the effect of reducing the thermal activity of Pb and the effect resulting from the increase in the film thickness synergistically suppress loss of Pb from the thick film due to volatilization to prevent compositional deviation from the superconductor composition.

Consequently, thick films having a Jc of 3800 A/cm$^2$ or more and an Ic of 25 A or more could be obtained, and it is conceivable that these thick films are applicable to various uses as practical oxide superconductor thick films, and that an oxide superconductive structure in which this oxide superconductor thick film is formed on the surface of the substrate or the board is applicable to uses such as, for example, a current lead, a magnetic shield, and the like.

The present invention is explained below in more detail based on an embodied example.

EMBODIED EXAMPLE

Powders of $Bi_2O_3$, PbO, $SrCO_3$, $CaCO_3$ and CuO were weighed to have a mole ratio of 1.85:0.35:1.90:2.05:3.05 and mixed together to produce mixed powder.

This mixed powder was calcined in the atmosphere at 780° C. for 10 hours to produce calcined powder.

The calcined powder was put in a ceramic pot together with zirconia balls as milling media and toluene as a solvent and set on a rotating table to be subjected to ball milling, and the calcined powder in the form of slurry for which the ball milling was completed was dried in a dryer.

The calcined powder after completion of the drying was burned again in the atmosphere at 780° C. for 10 hours and then subjected to ball milling and drying. It should be noted that the process was performed on the same milling conditions and drying conditions as those of the first time.

Then, this series of operation of "burning-milling-drying" was repeated three times to obtain superconductive synthetic powder.

Ethyl cellulose as an organic binder and dibutyl phthalate as an organic vehicle were added to the obtained superconductive synthetic powder and kneaded therewith using a triple roller to prepare a superconductive paste.

The prepared superconductive paste was applied in a thickness of 1060 $\mu$m to a MgO polycrystalline substrate having a length of 50 mm, a width of 5 mm, and a thickness of 1 mm and dried, and thereafter burned at burning temperatures of 835° C. to 840° C. for 100 hours.

Then, the thick film sample after the burning was pressed with a pressure of 3 ton/cm$^2$ using the CIP, and subsequently burned at burning temperatures of 835° C. to 840° C. for 100 hours.

As a result, a thick film sample of $(Bi, Pb)_{2+a}Sr_2Ca_2Cu_3O_z$ having a film thickness of 530 $\mu$m was obtained.

The Ic of the thick film sample was measured by the four probe method (the energization method) by providing electrodes on the obtained thick film sample using a silver paste and cooling the sample to 77 K with liquid nitrogen. Then, the measured Ic and the cross-sectional area of the sample were used to calculate the Jc.

As a result, this thick film sample exhibited an Ic of 165 A and a Jc of 6226 A/cm$^2$.

COMPARISON EXAMPLE 1

A superconductive paste similar to that prepared in the embodied example was applied in a thickness of 180 $\mu$m to a MgO polycrystalline substrate having a length of 50 mm, a width of 5 mm, and a thickness of 1 mm and dried, and thereafter burned at burning temperatures of 835° C. to 840° C. for 100 hours. Then, the thick film sample after the burning was pressed with a pressure of 3 ton/cm$^2$ using the CIP, and subsequently burned at burning temperatures of 835° C. to 840° C. for 100 hours. As a result, a thick film sample of $(Bi, Pb)_{2+a}Sr_2Ca_2Cu_3O_z$ having a film thickness of 90 $\mu$m was obtained. The obtained thick film sample exhibited a Jc of 700 A/cm$^2$ and an Ic of 3.15 A.

On the other hand, the superconductive synthetic powder obtained during the preparation of the superconductive paste was used and burned at burning temperatures of 835° C. to 840° C. for 100 hours to prepare a bulk body sample having a diameter of 25 mm, a thickness of 1.5 mm and a density of 5.1 g/cm$^3$ which has the same material composition as that of the superconductive paste. This bulk body sample exhibited a Jc of about 5000 A/cm$^3$.

Here, the thick film of the prepared thick film sample was obtained by peeling and subjected to quantitative analysis by the ICP on the concentration of each element contained in the thick film. At the same time, the concentration of each element in the bulk body sample was also subjected to quantitative analysis by the ICP.

The results of this analysis are explained with reference to FIG. 6. It should be noted that in a table in FIG. 6, normalization is carried out with the quantification result of each of the elements of Bi, Pb, Sr, Ca and Cu in the bulk body sample as 1, so that each quantification result of each element in the thick film sample with respect thereto is calculated and indicated.

Comparing the thick film sample and the bulk body sample, it was found from the results in FIG. 6 that Pb outstandingly decreases in thick film sample.

Figure 7:
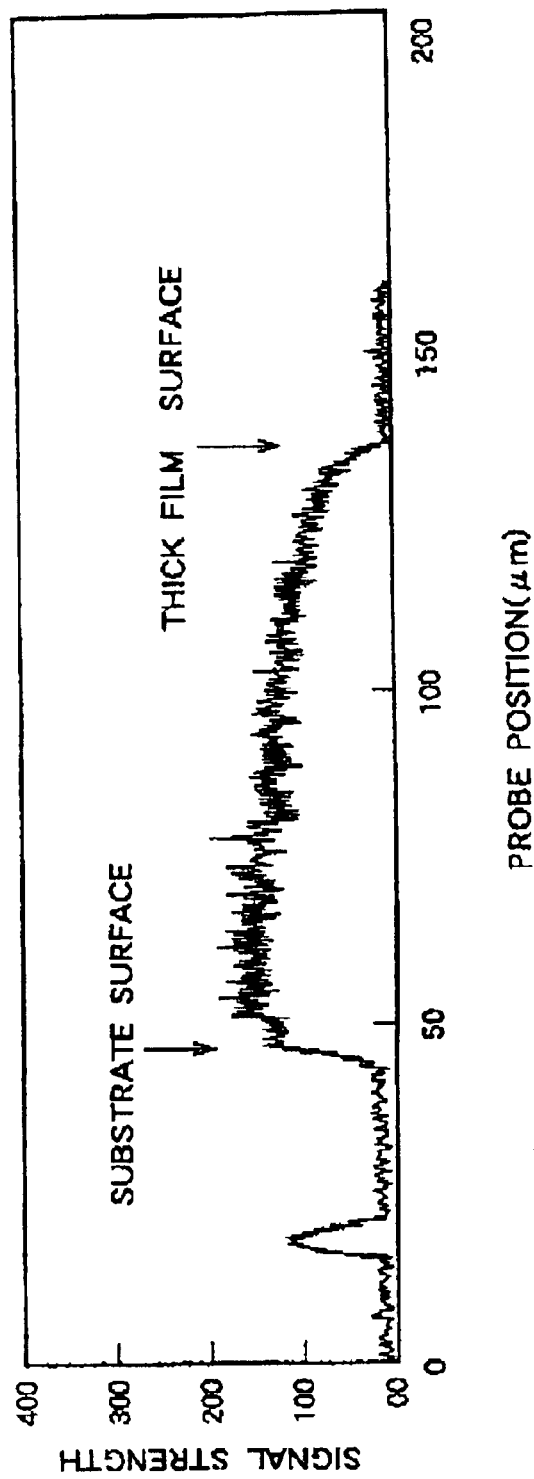
FIG. 7 is a graph showing results of line analysis of Pb in a direction of the film thickness in a thick film sample related to the prior art.

Subsequently, an analysis test in a direction of the film thickness was conducted on the Pb concentration in the thick film sample by the EPMA, and the results thereof are shown in FIG. 7. On a graph in FIG. 7, the vertical axis represents the value of the signal strength of Pb in the EPMA measurement. The horizontal axis represents the scanning position of an EPMA probe, the position of the interface between the substrate and the thick film sample being at about 43 $\mu$m and the position of the surface of the thick film being at about 136 $\mu$m.

From the results in FIG. 7, it was shown that the Pb concentration is high direct on the substrate and decreases toward the surface in the thick film sample.

The results in FIGS. 6 and 7 show that Pb is lost from a $(Bi, Pb)_{2+a}Sr_2Ca_2Cu_3O_z$ crystal in the burning step mainly from a portion closer to the surface of the thick film in the thick film sample in the comparison example, resulting in occurrence of compositional deviation from the superconductor composition. It is conceivable that this compositional deviation from the superconductor composition causes a decrease in the Jc of the thick film sample as compared to the bulk body.

COMPARISON EXAMPLE 2

Powders of $Bi_2O_3$, $SrCO_3$, $CaCO_3$ and CuO were weighed to have a mole ratio of 2:2:1:2 and mixed together to produce mixed powder.

This mixed powder was calcined in the atmosphere at 800° C. for 50 hours to produce calcined powder.

A series of operation of "burning-milling-drying" was performed three times, in the same manner as that of the embodied example, for the calcined powder to obtain superconductive synthetic powder of $Bi_2Sr_2Ca_1Cu_2O_y$.

The obtained superconductive synthetic powder was kneaded in the same manner as that of the embodied example to obtain a superconductive paste of $Bi_2Sr_2Ca_1Cu_2O_y$.

The prepared superconductive paste was applied in six types of thicknesses of 65 $\mu$m, 130 $\mu$m, 170 $\mu$m, 210 $\mu$m, 260 $\mu$m and 390 $\mu$m to MgO polycrystalline substrates each having a length of 50 mm, a width of 5 mm, and a thickness of 1 mm and dried, then burned at a burning temperature of 890° C. for 10 minutes to partially melt, and further gradually cooled to a burning temperature of 800° C. spending 10 hours for crystallization of the structure.

As a result, six types of thick film samples of $Bi_2Sr_2Ca_1Cu_2O_y$ having thicknesses of 50 $\mu$m, 100 $\mu$m, 130 $\mu$m, 160 $\mu$m, 200 $\mu$m and 300 $\mu$m were obtained.

The Jcs and Ics of the thick film samples were measured in the same manner as that of the embodied example.

The results are explained with reference to FIG. 4 and FIGS. 5A and 5B.

Figure 5A:
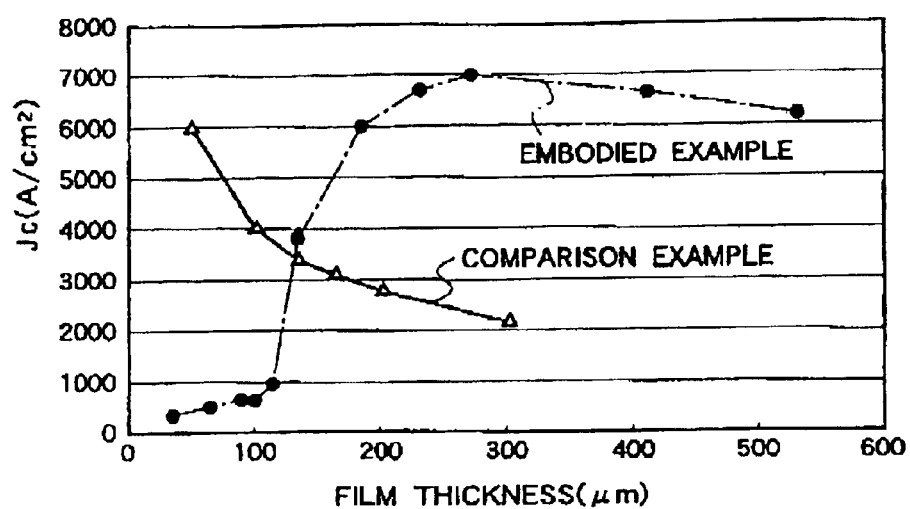
FIGS. 5A and 5B are graphs of the film thicknesses and the Jcs and Ics of the thick film samples according to the comparison example.
Figure 5B:
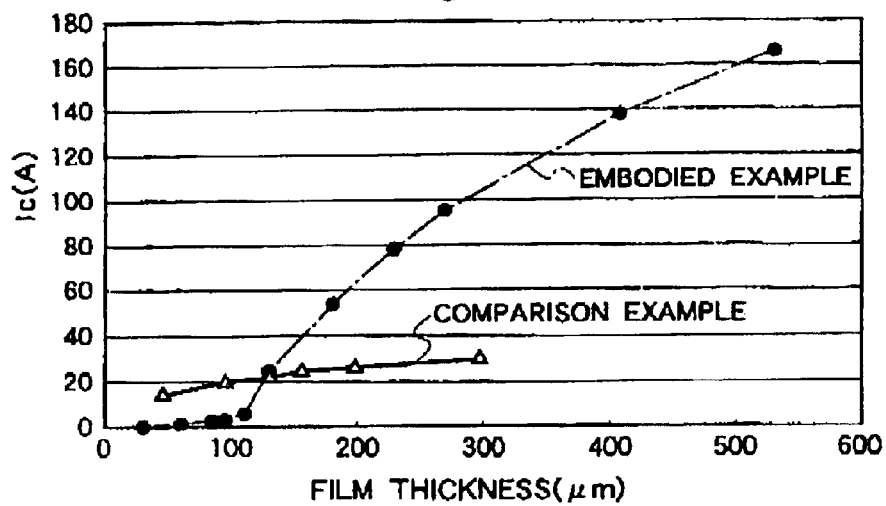

FIG. 4 is a table showing the film thicknesses and measurement results of the Jcs and Ics of the six types of the thick film samples, FIG. 5A is a graph showing the results in FIG. 4 with the Jc (A/cm$^2$) of the thick film sample plotted on the vertical axis and the film thickness ($\mu$m) of the thick film sample plotted on the horizontal axis, and FIG. 5B is a graph showing the results in FIG. 4 with the Ic (A) of the thick film sample plotted on the vertical axis and the film thickness ($\mu$m) of the thick film sample plotted on the horizontal axis. It should be noted that the measurement results of the embodied example of the thick film samples according to the present invention were shown together for comparison by a one-dotted chain line in FIGS. 5A and 5B.

As is clear from FIG. 4 and FIG. 5A, a Jc of the thick film sample of 6000 A/cm$^2$ was exhibited for the film thickness of the thick film formed on the MgO substrate of 50 $\mu$m, but the value of the Jc continued sharp decline with increases in film thickness such that the Jc of the thick film sample was 2067 A/cm$^2$ for a film thickness of 300 $\mu$m.

On the other hand, as is clear from, FIG. 4 and FIG. 5B, an Ic of the thick film sample of 15 A was exhibited for the thick film having a film thickness of 50 $\mu$m, but it just gradually increased with increases in film thickness such that the value thereof was 31 A even for a film thickness of 300 $\mu$m.

To obtain an oxide superconductor thick film having a high Jc and Ic, in the present invention, a thick film, which is an oxide superconductor containing Bi, Pb, Sr, Ca and Cu and is; characterized by having a film thickness of 130 $\mu$m or more, was formed on the surface of a substrate or a board, thereby obtaining the oxide superconductor thick film having a Jc and Ic reaching a practical range as described above in detail.

What is claimed is:

1. An oxide superconductor thick film containing Bi, Pb, Sr, Ca and Cu to be formed by applying oxide superconductive synthetic powder comprising the above elements onto surface of a substrate or a board and burning said powder, wherein 30 wt % or more of Pb contained in said applied oxide superconductive synthetic powder is retained in said thick film.

2. An oxide superconductor structure, wherein the oxide superconductor thick film according to claim 1 is formed on a surface of a substrate or a board.

* * * * *